United States Patent
Onisawa et al.

(12) 
(10) Patent No.: US 6,226,060 B1
(45) Date of Patent: May 1, 2001

(54) ACTIVE MATRIX TYPE LIQUID CRYSTAL DISPLAY DEVICE HAVING CHROMIUM ALLOY CONNECTING PORTIONS AT PIXEL ELECTRODE OR NEAR DRIVING CIRCUIT TERMINALS

(75) Inventors: Kenichi Onisawa, Hitachinaka; Kikuo Ono, Naka-machi; Toshiki Kaneko, Chiba; Kenichi Chahara; Katsunori Nakajima, both of Hitachi; Etsuko Nishimura, Hitachioota; Takeshi Satou, Hitachi; Tetsuro Minemura, Hitachioota, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/958,672

(22) Filed: Oct. 27, 1997

(30) Foreign Application Priority Data

Nov. 1, 1996 (JP) .................................................. 8-291899

(51) Int. Cl.[7] ........................... G02F 1/136; G02F 1/1345
(52) U.S. Cl. .............................................. 349/43; 349/149
(58) Field of Search ..................................... 349/149, 150, 349/151, 152, 43

(56) References Cited

U.S. PATENT DOCUMENTS

| 5,071,800 | * | 12/1991 | Iwamoto et al. | 501/126 |
|---|---|---|---|---|
| 5,401,701 | * | 3/1995 | Ogawa et al. | 501/134 |
| 5,483,082 | * | 1/1996 | Takizawa et al. | 257/29 |
| 5,739,877 | * | 4/1998 | Onisawa et al. | 349/42 |
| 5,777,710 | * | 7/1998 | Okada et al. | 349/148 |
| 5,835,177 | * | 11/1998 | Dohjo et al. | 349/152 |

* cited by examiner

*Primary Examiner*—Walter J. Malinowski
(74) *Attorney, Agent, or Firm*—Antonelli, Terry, Stout & Kraus, LLP.

(57) ABSTRACT

In an active matrix type liquid crystal display device, at least material of one element, forming the connecting portion between signal transfer lines related to the scan lines and the data signal lines of the device, is an alloy of at least a chemical element selected from the group consisting of Nb, Mo, Ta, and W, with Cr, the scan lines and means for generating scan pulses are connected to each other via a first opening formed in an insulating film, the data signal lines and the means for generating image data are connected to each other via a second opening formed in an insulating film, a polycrystalline thin film, which is connected to the means for generating scan pulses, is inserted into the first opening, and a polycrystalline thin film, which is connected to the means for generating image data, is inserted into the second opening, and the polycrystalline thin film is composed of indium tin oxide, which is made of mainly indium oxide and added tin oxide, having a specific resistance of, at the utmost, $6 \times 10^{-4}$ $\Omega$cm.

23 Claims, 6 Drawing Sheets

ACTIVE MATRIX TYPE LIQUID CRYSTAL DISPLAY DEVICE HAVING CHROMIUM ALLOY CONNECTING PORTIONS AT PIXEL ELECTRODE OR NEAR DRIVING CIRCUIT TERMINALS

BACKGROUND OF THE INVENTION

The present invention relates to a liquid crystal display device, and more particularly to an active matrix type liquid crystal display device using thin film transistors (TFT).

In an active matrix type liquid crystal display device, a TFT (thin film transistor) is used as a semiconductor operating element (switching element). An inverted staggered structure is generally used for the structure of the TFT, wherein gate electrodes are formed on a substrate and signal lines and other electrodes are formed thereon. Practically, scan signal lines (such as gate lines and gate electrodes) are formed on a transparent insulating substrate, a gate insulating layer is formed thereon, a semiconductor layer is formed on the upper portion of the gate insulating layer, drain electrodes (data lines) and source electrodes are formed on the semiconductor layer, and transparent pixel electrodes are connected to the source electrodes. An image signal voltage is supplied to the drain electrodes (data lines). A liquid crystal display device using such a TFT structure is disclosed, for instance, in JP-A-2-48639 (1990).

When a driving circuit is formed on a periphery of the substrate, any of two kinds of mounting methods, such as TCP (Tape Carrier Package) and COG (Chip On Glass) methods, have been used.

Conventionally, the TCP method has been used more widely than the COG method. However, currently, the COG method is becoming to be used more widely in view of its superiority in cost reduction, finer pitch formation, and other advantages.

In accordance with the COG method, there are three kinds of connections, such as a connection of the input terminal of the driving circuit chip with the substrate, a connection of the output terminal of the driving circuit chip with the substrate, and a connection of the substrate with a FPC (Flexible Printed Cable) which is connected to an external circuit. And, an ACF (Anisotropic Conductive Film) is inserted at each of the above connections so that the connection is established via the ACF. In order to ensure reliability of the connection in the above case, an indium tin oxide (ITO) film, which is composed mainly of indium oxide to which tin oxide is added, is used as a wiring material of the substrate.

The liquid crystal display device using TFT technology has a feature that the display quality is superior, because active driving is possible. However, the process for forming a TFT onto the substrate is complex, and at least six separate photolithograpy processes are required. The reason for this is that six kinds of fundamental elements (film) are required for constructing the TFT, such as a scan signal line (gate lines), a gate insulating film, a semiconductor layer, a drain electrode (data line, generally as same as source electrode), a transparent pixel electrode, and a passivation layer, and patterning of each of the above films is performed by photolithography. Furthermore, because the thickness of all of the above films is several hundreds nm, and the width of the line formed by the patterning is small, such as in the order of 10 $\mu$m, breakage of the lines (particularly, the data line and transparent pixel electrode) readily occurs, when they are contaminated with foreign particles, or at a portion crossing over a step on the base, and, if the patterning is not performed precisely in the photolithography process, a short circuit between electrodes or lines is readily created. If surface contamination during the process is added as a further consideration, it is seen that the electrical contact resistance between the source electrode and the transparent pixel electrode, and the gate line, or the data line, and the transparent pixel electrode at the terminal portion around the substrate, is increased significantly. Once the above phenomena are generated, defects in the display of data by the liquid crystal display device result. That means that the production yield of the substrate is decreased, and the production cost is increased.

As one of the conventional methods of increasing the production yield, a structure has been proposed wherein an insulating film between layers (passivation layer) is provided on the source electrode and the drain electrode of the TFT, and the source electrode and the drain electrode are connected with the pixel electrode via an opening provided in the insulating film between layers. In such a structure, a short circuit between the source electrode and the drain electrode with the pixel electrode, which is readily created when these electrodes are formed on the same plane, can be prevented.

However, in the conventional liquid crystal display device, decreasing the contact resistance at the connecting portion of each of the elements, which form conductive paths for electrical signals, has not been considered thoroughly when mounting the driving circuit, the TFT, and other elements on the substrate of the liquid crystal display device, and, particularly, a problem, such as low production yield of the terminal connecting portion, has not been solved. That is, in order to decrease the contact resistance when the driving circuit chip is connected with the drain line, the drain line is composed of Cr (chromium), an ITO film is arranged at the surface of the driving circuit chip, and the drain line and the driving circuit chip are contacted all through the surface so as to increase the contact area. On the other hand, the area of the region, other than the displaying region of the display panel (peripheral area), is required to be decreased. However, if the area of the contacting portion is decreased in order to meet this requirement, the contact resistance can not be decreased, because the specific contact resistance (the contact resistance per unit area) between ITO and Cr is high. If the area of the contacting portion is increased, water is liable to enter through a defect, such as a pin-hole and the like, in the resin used for packaging, and degradation of the contacting portion may readily occur.

SUMMARY OF THE INVENTION

One of the objects of the present invention is to provide an active matrix type liquid crystal display device, which is capable of decreasing the contact resistance at the contacting portions between each of the elements forming the conductive paths for signals.

In accordance with the present invention, the active matrix type liquid crystal display device comprises a liquid crystal layer including a liquid crystal material which forms a plurality of pixels, a pair of substrates, at least one of which is transparent, the substrates being arranged to face each other while holding the liquid crystal layer therebetween, means for generating scan pulses, means for generating image data, a plurality of scan lines, which are arranged dispersedly on one substrate of the pair of substrates and are connected to the means for generating scan pulses, and a plurality of data signal lines, which are arranged so as to intersect with the plurality of scan lines in a manner to form a matrix and are connected to the means for generating image data, and further, comprising, in a plurality of display regions surrounded by the plurality of the scan lines and the plurality of the date signal lines, transparent pixel electrodes arranged on one substrate of the pair of substrates, counter electrodes arranged to face the transparent pixel electrodes holding the liquid crystal layer therebetween and supplied with a liquid crystal driving voltage, and an insulating film which covers the respective semiconductor active elements for driving the pixels connected to the scan lines, the data signal lines, and the transparent pixel electrodes, the respective scan lines, the respective data signal lines, and the respective semiconductor active elements for driving the pixels, wherein at least the material of one element forming the connecting portion of the elements, which compose the signal transfer lines related to the scan lines and the data signal lines, is an alloy of at least a chemical element selected from the group consisting of Nb, Mo, Ta, and W, with Cr, the scan lines and the means for generating scan pulses are connected to each other via a first opening formed in the insulating film, the data signal lines and the means for generating image data are connected to each other via a second opening formed in the insulating film, a polycrystalline thin film, which is connected to the means for generating scan pulses, is inserted into the first opening, and a polycrystalline thin film, which is connected to the means for generating image data, is inserted into the second opening, and the polycrystalline thin film is composed of indium tin oxide, which is made of mainly indium oxide and added tin oxide, having a specific resistance of, at the utmost, $6 \times 10^{-4}$ $\Omega$cm.

Furthermore, in accordance with another feature of the present invention, the active matrix type liquid crystal display device comprises a liquid crystal layer including a liquid crystal which forms a plurality of pixels, a pair of substrates, at least one of which is transparent, arranged to face each other with the liquid crystal layer interposed therebetween, means for generating scan pulses, means for generating image data, a plurality of scan lines, which are arranged dispersedly on one substrate of the pair of substrates and connected to the means for generating scan pulses, and a plurality of data signal lines, which are arranged so as to intersect with the plurality of the scan lines in a manner to form a matrix and are connected to the means for generating image data, and further comprising, in a plurality of display regions surrounded by the plurality of the scan lines and the plurality of the data signal lines, transparent pixel electrodes arranged on one substrate of the pair of substrates, counter electrodes arranged to face the transparent pixel electrodes with the liquid crystal layer interposed therebetween and supplied with a liquid crystal driving voltage, and an insulating film which covers respective semiconductor active elements for driving the pixels connected to the scan lines, the data signal lines, and the transparent pixel electrodes, respective scan lines, respective data signal lines, and respective semiconductor active elements for driving the pixels, wherein at least the material of one element of the elements forming the connecting portion of the elements, which compose the signal transfer lines related to the scan lines and the data signal lines, is an alloy of at least a chemical element selected from a group consisting of Nb, Mo, Ta, and W, with chromium (Cr), the scan lines and the means for generating scan pulses are connected vie a first opening formed in the insulating film, the data signal lines and the means for generating image data are connected via a second opening formed in the insulating film, electrodes of the semiconductor active element for driving a pixel and the transparent pixel electrodes are connected via a third opening formed in the insulating film, a polycrystalline thin film, which is connected to the means for generating scan pulses, is inserted into the first opening, a polycrystalline thin film, which is connected to the means for generating image data, is inserted into the second opening, and a polycrystalline thin film, which is connected to the transparent pixel electrodes, is inserted into the third opening, and the polycrystalline thin film is composed of indium tin oxide, which is made of mainly indium oxide and added tin oxide, having a specific resistance of, at the utmost, $6 \times 10^{-4}$ $\Omega$cm.

In composing the above liquid crystal display device, the following features can be added:

(1) The content of the chemical element which forms the alloy film with chromium is in the range from 20 to 80% by weight.

(2) The scan lines and the means for generating scan pulses are formed via a plurality of the first openings formed along the scan lines, and the data signal lines and the means for generating image data are connected to each other via a plurality of the second openings formed along the data signal lines.

(3) The specific contact resistance of the polycrystalline film and the alloy at respective ones of the first opening, the second opening, and the third opening is, at the utmost, $1 \times 10^5$ $\Omega$ $\mu m^2$.

(4) Scan pulse transmitting lines, which are arranged in other regions than the display region on the substrate as lines belonging to the means for generating scan pulses and for transmitting the scan pulses, are connected with other elements by an anisotropic conductive film, image data transmitting lines, which are arranged in other regions than the display region on the substrate as lines belonging the means for generating image data and transmitting the image data, are connected with other elements by the anisotropic conductive film, polycrystalline thin film is formed on the plane of the scan pulse transmitting lines connecting the other elements and of the image data transmitting lines connecting the other elements, and the polycrystalline thin film is composed of indium tin oxide, which is made of mainly indium oxide and added tin oxide, having a specific resistance of, at the utmost, $6 \times 10^{-4}$ $\Omega$cm.

In accordance with the means described above, the contact resistance at the connecting portion can be decreased, because at least one element of the elements forming the connecting portion of the elements, which compose the signal transfer lines, is made of an alloy of at least a chemical element selected from a group consisting of Nb, Mo, Ta, and W, with chromium (Cr). Therefore, the production yield of the circuit elements can be improved even if the area of the mounting region of the circuit element is decreased.

BRIEF DESCRIPTION OF THE DRAWINGS

These and other objects, features, and advantages of the present invention will be understood more clearly from the following detailed description when taken with reference to the accompanying drawings, wherein.

DESCRIPTION OF THE PREFERRED EMBODIMENTS

Hereinafter, embodiments of the present invention will be explained with reference to the drawings.

Embodiment 1

Figure 1:
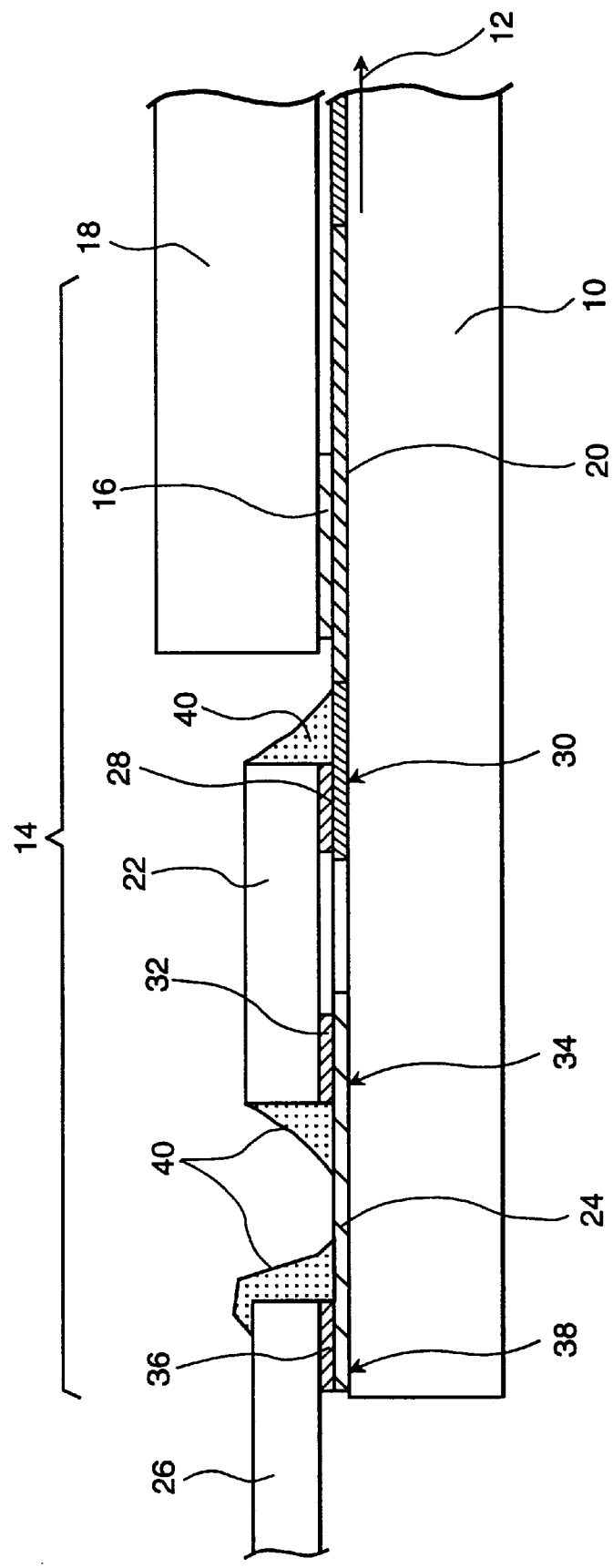
FIG. 1 is a schematic cross section of the drain terminal portion of the liquid crystal display device representing an embodiment of the present invention.

FIG. 1 is a schematic cross section of the drain terminal portion of the active matrix type liquid crystal display device representing a first embodiment of the present invention. In FIG. 1, a transparent insulating substrate 10 is provided in the form of a flat plate as one of elements which make up a display panel. A display region 12 is formed in the region indicated by an arrow on the transparent insulating substrate 10, and a drain terminal portion 14 is formed at periphery of the substrate. A color filter substrate 18 is formed on the display region 12 of the transparent insulating substrate 10 via a sealing agent 16, and a plurality of drain lines 20, operating as data signal lines, are formed dispersedly on the transparent insulating substrate 10. A plurality of scan lines (omitted in the drawing) are formed via an insulating layer so as to intersect with each of the drain lines 20 in a manner to form a matrix, and transparent pixel electrodes, counter electrodes, TFT (thin film transistors) operating as semiconductor active elements for driving the pixel, and the like, are formed in each of the plural display regions surrounded by each of the drain lines 20 and signal lines corresponding to each of the pixels. A liquid crystal layer, including the liquid crystal material forming the pixel, is formed between the substrate 10 and the color substrate 18.

A driving circuit chip 22, terminal lines 24, and FPC (Flexible Printed Cable) 26 are formed by a COG method at the drain terminal portion 14. The driving circuit chip 22 is provided with circuit elements, such as a shift resister and the like, and is composed as an element of the means for generating image data. Bumps made of gold are formed at both and portions of the bottom plane of the driving circuit chip 22, so that one of the bumps is connected to a pad portion 30 of the drain line 20 via the anisotropic conductive film (ACF) 28, and the other of the bumps is connected to a pad portion 34 of the terminal line 24 via the anisotropic conductive film (ACF) 32. Plastic grains, which are plated with nickel and gold sequentially, are dispersed in the anisotropic conductive films 28, 32, so that the bump made of gold and the pad portions 30, 34 may be connected by adding pressure and heat between the bump made of gold and the pad portions 30, 34 to collapse the plastic grains. That means that the anisotropic conductive film 28, 32 is conductive in a direction normal thereto, but insulative in a horizontal direction. The FPC 26 is connected to an external power source or a timing circuit, and a wiring pattern made of copper formed at the bottom of the FPC 26 is connected to the pad portion 38 of the terminal line 24 via the anisotropic conductive film 36. The pad portions 30, 34 and 38 are insulated from the atmosphere since a resin for packaging 40 is applied around the pad portions 30, 34 and 38.

Figure 2A:
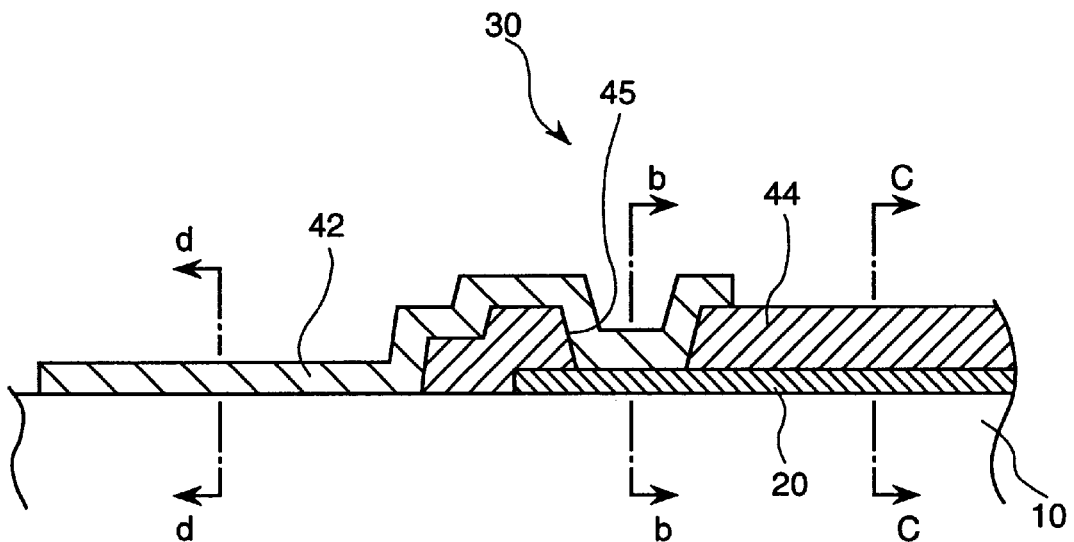
FIGS. 2A, 2B, 2C, and 2D show respective cross sections of the terminal connecting portions.
Figure 2B:
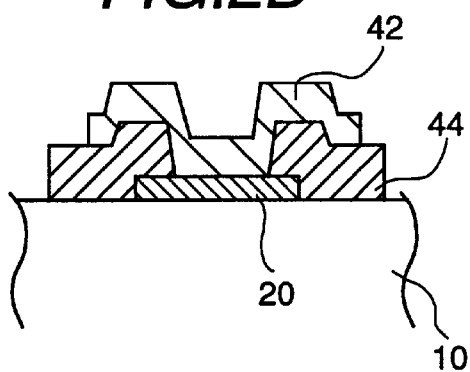
Figure 2C:
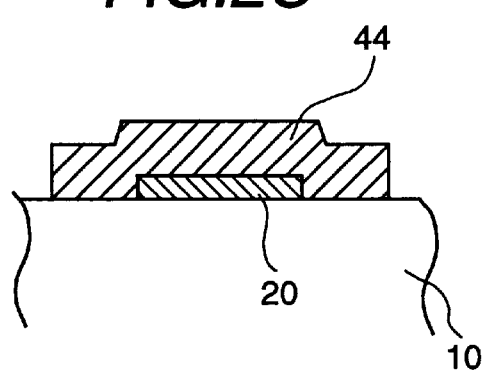
Figure 2D:
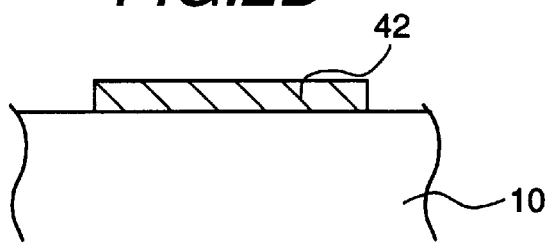
Figure 3:
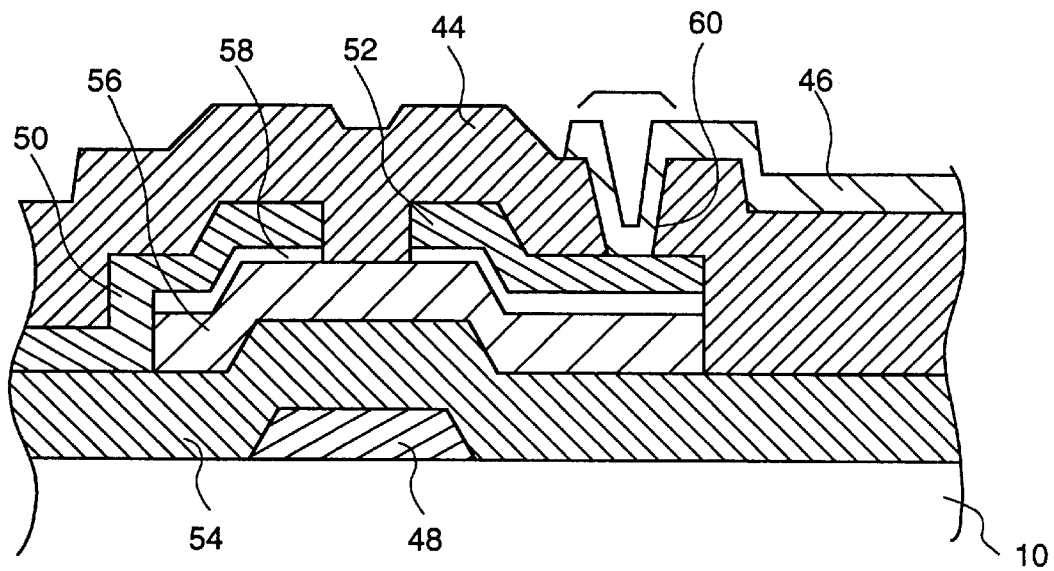
FIG. 3 is a cross section of the TFT element.

The pad portion 30 is provided with an indium tin oxide film (hereinafter, called as ITO film) 42 and a protective film 44, as shown in FIG. 2A, and the ITO film 42 is connected to the drain line 20 via an opening 45 formed at an end portion of the protective film 44 which covers the drain line 20. The drain line 20 is made of an alloy of Cr and Mo, as stated later, and the contact resistance at the connecting portion of the element to the element which composes the signal transfer lines can be decreased by connecting the drain line 20 made of the alloy with the ITO film 42. An end portion of the ITO film 42 is connected to the bump of the driving circuit chip 22 via the anisotropic conductive film 28. The ITO film 42 is formed with the same material using the same procedure as used for the transparent pixel electrode 46, which is formed with the TFT element, as shown in FIG. 3. The TFT element is provided with a gate electrode 48, a drain electrode 50, and a source electrode 52, which are formed on the transparent insulating substrate 10. Gate insulating layer 54 is formed on the gate electrode 48, and an amorphous silicone (a-Si) semiconductor layer 56 is formed on the gate insulating layer 54. An $n^+$.a-Si layer 58, wherein the amorphous silicone is doped with phosphorus (P) in a high concentration, is formed on the amorphous silicone semiconductor layer 56, and the amorphous silicone semiconductor layer 56 is connected to the drain electrode 50 and the source electrode 52 via the $n^+$.a-Si layer 58. The drain electrode 50 and the source electrode 52 are separated by the protective film 44, and the source electrode 52 is connected with the transparent pixel electrode 46 via an opening 60 formed in the protective film 44. When the TFT is operated by the scan pulse signal applied to the gate electrode 48, the pulse signal by the image data supplied to the drain electrode 50 is applied to the transparent pixel electrode 46, and an electric field is applied to the liquid crystal. With the application of the electric field to the liquid crystal, the transparency of the pixel portion is changed, and an image corresponding to the image data is displayed.

Figure 4A:
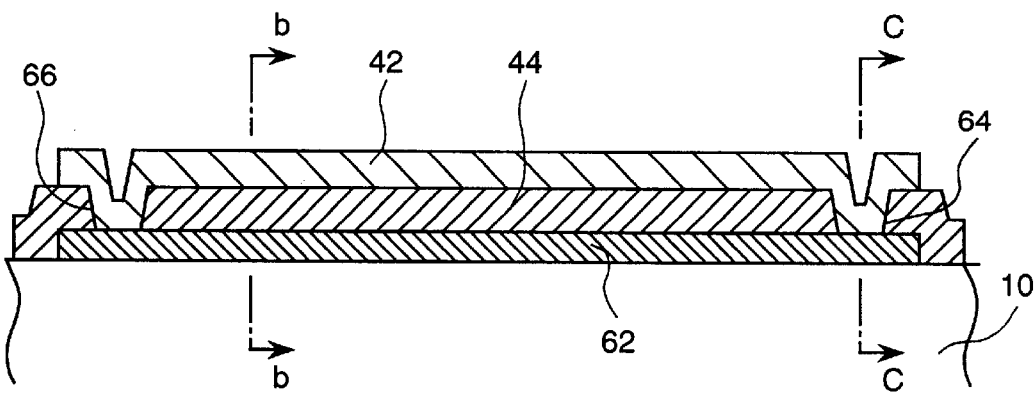
FIGS. 4A, 4B, and 4C show respective cross sections of the terminal lines.
Figure 4B:
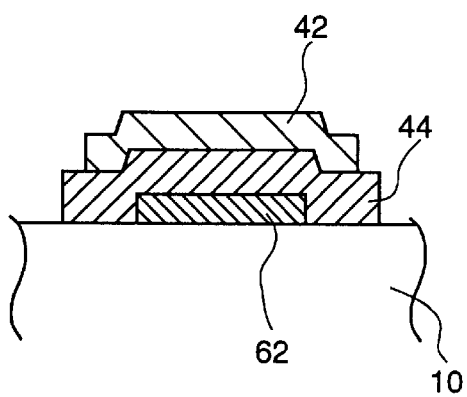
Figure 4C:
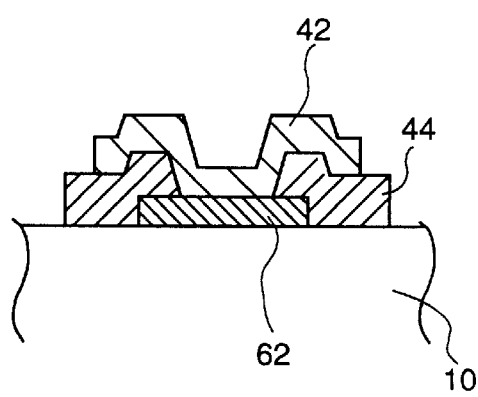

The pad portions 34, 38 of the terminal line 24 are composed with a double layered structure, as shown in FIG. 4A, because high frequency signals, such as timing signals and the like, are input from FPC 26. That is, the terminal line 24 is composed of the alloy film 62, which is formed with the same material and is made by the same procedure as the drain line 20, and the ITO film 42, which is formed by the same procedure as the transparent pixel electrode 46. The alloy film 62 is composed of an alloy of Cr and Mo and is formed on the transparent insulating substrate 10. The alloy film 62 is covered with the protective film 44. Openings 64, 66 are formed in the protective film 44 at both sides of the alloy film 62. A part of the ITO film 42, which is laminated onto the protective film 44, is inserted into the openings 64, 66 of the protective film 44, so that the ITO film 42 and the alloy film 62 are connected at the openings 64, 66. The ITO film 42 at the opening 64 is connected to the bump made of gold of the driving circuit chip 22 via the anisotropic conductive film 28, and the ITO film 42 at the opening 66 is connected to the wiring pattern of the FPC 26 via the anisotropic conductive film 36. The contact resistance at the interface between the alloy film 62 and the ITO film 42 can be decreased, because the alloy film 62 is composed of an alloy of Cr and Mo. The alloy film 62 is connected to the ITO film 42 only via the openings 64, 66, and other portions are covered with the protective film 44. Therefore, entry of water can be double-prevented by applying a resin for packaging around the terminal lines 24. Because the end portions of the alloy film 62 are covered with the protective film 44, and the ITO film 42 is connected only via the openings 64, 66, whereby an increase in the contact resistance and the possibility that the terminal line 24 will break with generation of a cell reaction (corrosion) between the alloy film 62 and the ITO film 42 caused by the entry of water can be prevented, so that the reliability can be improved.

In accordance with the present embodiment, the contact resistance at the connecting portion of the drain line 20 with the ITO film 42 in the signal transmitting path for transmitting the image data can be decreased, because the drain line 20 is formed with an alloy of Cr and Mo to connect the drain line 20 and the ITO film 42.

In accordance with the present embodiment, the connecting portion of the elements which make up the signal transmitting path for transmitting the image date has been explained. However, the same structure as the previous embodiment can be applied to the connecting portion of the elements which make up the transmitting path for transmitting scan pulses from the means for generating scan pulses. In this case, the contact resistance of the connecting portion can also be decreased.

Embodiment 2

Hereinafter, a method of manufacturing films which form the drain line 20 and the terminal line 24 will be explained.

First, the drain line 20 and the terminal line 24 were deposited using a conventional DC magnetron sputtering apparatus, and then the characteristics of the film were evaluated. The evaluation revealed that the specific resistance and film stresses in the film could be improved significantly by using an alloy of Cr added with Mo in comparison with the Cr film which had been widely used as the gate line and the drain line. Furthermore, the contact characteristics of the alloy of Cr added with Mo with ITO was evaluated. The evaluation revealed that the contact characteristics of the alloy of Cr added with Mo with ITO was significantly improved in comparison with the contact characteristics of Cr film with ITO.

In accordance with the above findings, a Cr—Mo alloy film was formed on a plate of non-alkaline borosilicate glass, which was the same size as the mass production products (370 mm×470 mm×0.7 mm thickness), using a cluster type DC magnetron sputtering apparatus which recently has been widely used in mass production lines for making the TFT. The Mo content in the Cr—Mo alloy target was 50% by weight. The target was manufactured by the steps of mixing Cr powder of 50% by weight and Mo powder of 50% by weight, enclosing the mixture in a can, pressing it with a HIP (Hot Isostatic Pressing) method, machining it to form a size of 260 mm×243 mm×6 mm, and pasting six of the fabricated sheets onto a backing plate made of copper. The Cr—Mo alloy films were deposited to a thickness of 200 nm with a sputtering power of 9.6 kw, using an argon gas pressure of 0.4 Pa. The sheet resistance was determined by a four points probe method, the film thickness was determined by a stylus type profiler, and the specific resistance was calculated from the above observed values. The film was formed on a Si wafer, the warp of the wafer was determined, and the film stress was calculated from the above observed values. The obtained results are indicated in Table 1.

TABLE 1

| Temperature of the substrate (° C.) | Specific resistance ($\mu\Omega$m) | Film Stress (MPa) |
| --- | --- | --- |
| 25 | 21 | 600 |
| 130 | 19 | 400 |
| 200 | 18 | 0 |

In order to provide a comparison with the results on the Cr—Mo alloy film (Table 1), the same experiment was performed for the conventional 100% Cr film, and the results indicated in Table 2 were obtained.

TABLE 2

| Temperature of the substrate (° C.) | Specific resistance ($\mu\Omega$m) | Film Stress (MPa) |
| --- | --- | --- |
| 25 | 22 | 1100 |
| 130 | 21 | 1000 |
| 200 | 19 | 900 |

Table 1 reveals that, when the Cr—Mo alloy film is used, both the specific resistance and the film stress are decreased in accordance with an increase in the temperature of the substrate, and the film stress becomes approximately zero (0) at 200° C. of the substrate temperature.

In comparison with the results on the Cr film shown in Table 2, it is revealed that the Cr—Mo alloy film has a lower specific resistance and a significantly lower film stress. Further investigation was performed in the case of a substrate temperature of 130° C., and, although the characteristics of the Cr film were not improved, the specific resistance and the film stress of the Cr—Mo alloy film could be decreased to 18 $\mu\Omega$cm and 180 MPa, respectively, by optimizing the sputtering power and pressure.

In order to observe the structure of the obtained film, the Cr—Mo alloy film and the Cr film, both deposited at 200° C., were observed by a scanning electron microscope (SEM). As a result, a domain structure having a grain size of approximately 500 nm, which was composed of subgrains of 50–100 nm, was observed in the Cr—Mo alloy film. In the domain structures, each grain of approximately 500 nm in size is assumed to behave as a single crystalline grain. As a result of observing the cross section of the Cr—Mo alloy film, grain boundaries could not observed clearly. This showed that the large size grains were compacted densely. Furthermore, the cutting cross section of the film was seen as if it were torn off, meaning that the film was soft, in other words, superior in elasticity. On the contrary, the Cr film had a small grain size, such as, at the utmost, 50 nm, and the grain boundary could be observed clearly. Accordingly, it can be concluded that small grains were compacted coarsely in the Cr film, and the elasticity of the film was small.

Embodiment 3

Hereinafter, the patterning characteristics of the Cr-50 wt % Mo alloy films, of the type prepared in the embodiment 2, will be explained.

After forming a wiring pattern of resist by photolithography, an etching process was performed using a cerium (IV) nitrate aqueous ammonium 15% solution, which had been used as an etching solution for Cr. A shower type device was used for the etching process.

The cross section of the formed Cr—Mo alloy film pattern was observed by a scanning electron microscope. As a result, it was revealed that, in contrast to the pattern edge of the Cr wiring line which protrudes perpendicularly from the substrate, the pattern of the Cr—Mo alloy film has an edge with a tapered shape, and the angle of the taper was approximately 50 degrees. Furthermore, a relationship between the angle of taper and the manufacturing process was investigated in detail. From this, it was revealed that the taper was formed depending on the baking condition of the photoresist and the jet pressure in the shower etching process, and it was verified that the taper could be well reproduced at the edge of the wiring pattern by controlling the above conditions. The reason why the Cr film does not form a tapered shape well is assumed to be due to the fact that the adhesive force of the Cr film is so strong that the etching solution can not penetrate the interface between the Cr film and the photoresist. The tapered shape of the Cr—Mo alloy film is achieved by penetration of the etching solution between the film and the resist and the progress of the etching in a lateral direction (in a perpendicular direction to the film thickness) isotopically.

Embodiment 4

The contact characteristics of the Cr film with the ITO film, and of the Cr—Mo alloy film with the ITO film, will be explained hereinafter.

Respective of ones of the Cr film and the Cr—Mo (50% by weight) alloy film were deposited onto a cleaned glass plate by a cluster type DC magnetron sputtering apparatus. In the above cases, the temperature of the substrate was 200° C., and the thickness of the film was 200 nm. The film was manufactured to plural wiring patterns by photolithography, wherein the width of the line was 30 $\mu$m, and a pad to place a needle for measurement was provided at the end portion of the line. Both the Cr film and the Cr—Mo (50% by weight) alloy film were processed by a wet etching method using a cerium (IV) nitrate aqueous ammonia solution. After stripping off the resist, the SiN film was formed onto the metal wiring pattern by a plasma enhanced chemical vapor deposition (CVD) method as an insulating film between wiring layers. In these cases, the temperature of the substrate was 300° C., and the thickness of the film was 350 nm. Then, through-hole patterns were formed in the SiN film on the metal wiring patterns by photolithography. The through-holes in the SiN film were manufactured by a dry etching method using a $CF_4$ and $O_2$ mixed gas. After stripping off the resist, the ITO film was deposited by a DC magnetron sputtering method (in this process, a conventional in-line type apparatus was used).

Then, a case wherein the temperature of the substrate was 200° C. and an Ar and $O_2$ mixed gas was used for the sputtering process, and another case wherein the temperature of the substrate was room temperature and an Ar and $H_2O$ mixed gas was used for the sputtering process, were studied. In the former case, the deposited ITO film has a polycrystalline state (hereinafter, called as p-ITO), and in the latter case, the ITO film was amorphous (hereinafter, called as a-ITO). In the case of amorphous ITO, the film finally crystallizes to a polycrystalline ITO film, because the film is heated at the utmost to 240° C. in the subsequent process. The thickness of the film in both cases was 140 nm. Subsequently, patterning of the ITO film was performed by photolithography to prepare patterns for evaluating the contact resistance, wherein the ITO wiring pattern intersected at a right angle with the metal wiring pattern via a through-hole opening in the SiN film. Then, after producing a current flow from Cr to ITO, respective values of voltage drop V at the contact portions of the Cr film with the ITO film, and of the Cr—Mo alloy film with the ITO film, was measured by a four points probe method, and the specific contact resistance was calculated from the observed values. The results are indicated in Table 3.

TABLE 3

| (Unit: $\Omega\mu m^2$) | Cr—Mo | Cr |
|---|---|---|
| p-ITO | <1 × 10³ | 2 × 10⁵ |
| a-ITO | 5 × 10⁴ | >5 × 10⁶ |

In accordance with Table 3, it is revealed that, when the Cr—Mo alloy film is used as the metal film, the specific contact resistance with the ITO film is smaller than the case when the Cr film is used as the metal film, regardless of whether the ITO may be polycrystalline or amorphous. As explained later, it was shown that the specific contact resistance at the pad portions 30, 34, 38 should be smaller than 1×10⁵ $\Omega\mu m^2$. Therefore, in the case of the Cr film, the contact characteristics were insufficient.

The above-mentioned contact resistance was found to be dependent on the resistance of the ITO film itself. That is, when the specific resistance of the ITO film itself is larger than 6×10⁻⁴ $\Omega$cm, the specific contact resistance can not be decreased to a value lower than 1×10⁵ $\Omega\mu m^2$, even if the Cr—Mo alloy film is used. Furthermore, the specific resistance of the ITO film itself varies depending on the sputtering conditions. For instance, the specific resistance of the p-ITO is increased when the $O_2$ content is excessive, and the specific resistance of the a-ITO is increased when the $H_2O$ content is excessive. When the amount of $H_2O$ added to Ar is less than 2%, the specific contact resistance can be decreased to a value equal to or less than 1×10⁵ $\Omega\mu m^2$.

Embodiment 5

Hereinafter, the composition of the display portion of a liquid crystal display device (TFT-LCD) manufactured using the techniques established by the above embodiments will be explained.

Figure 5:
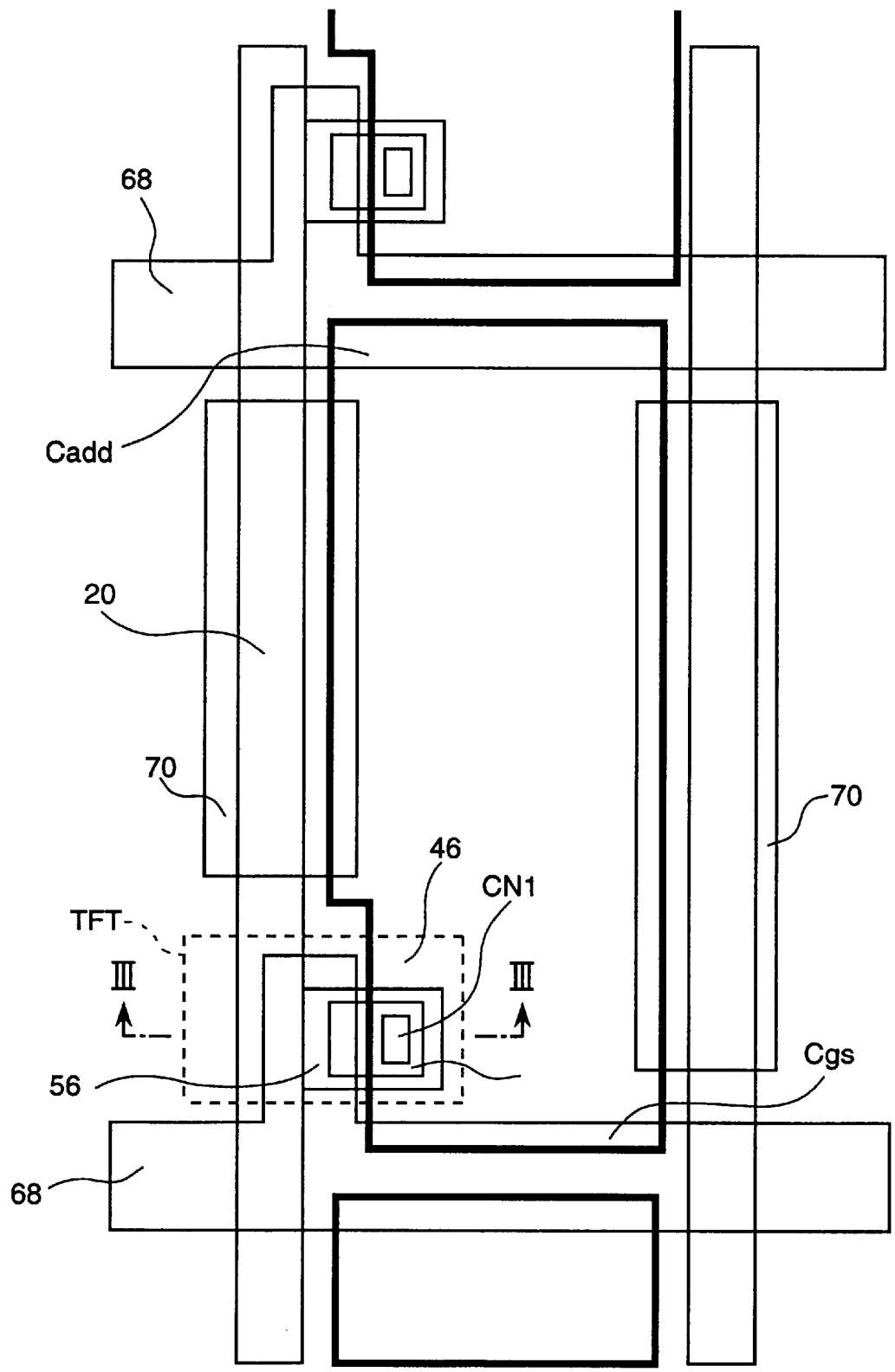
FIG. 5 is a plan view of the pixel portion of the TFT panel.
Figure 6A:
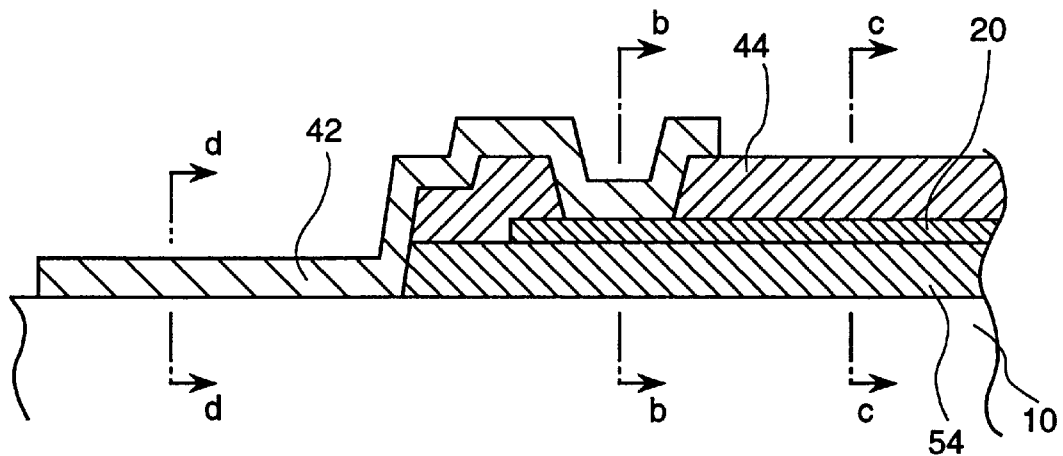
FIGS. 6A, 6B, 6C, and 6D show respective cross sections of the drain terminals when the number of photomasks is taken as 5.
Figure 6B:
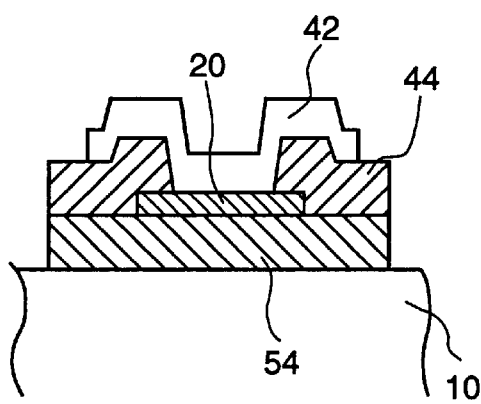
Figure 6C:
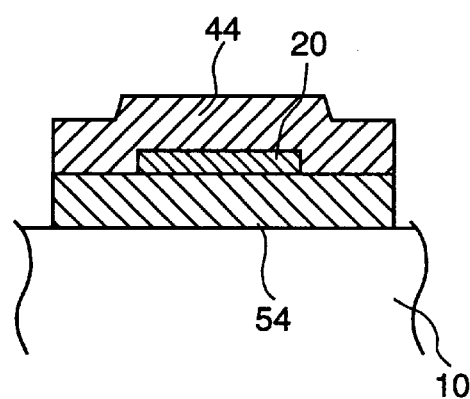
Figure 6D:
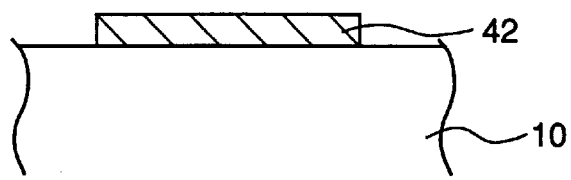

FIG. 5 is a schematic plane view of a pixel in the display portion of the liquid crystal display device. The structure of the TFT portion of the manufactured device is the same as that of FIG. 3, and the drain terminal portion is as same structure as that indicated in FIG. 2 and FIG. 4A. In FIG. 5, the TFT is formed in addition to the pixel electrode 46 in the display region surrounded with the drain line 20 and the gate line 68. The source electrode 52 in the TFT and the pixel electrode 46 are connected electrically to each other vie a contact hole CN1 opened in the protective film 44. By adopting the above structure, the following advantages can be achieved:

(1) Because the drain line 20 and the pixel electrode 46 are provided in respectively different layers, the probability that a short circuit will be created between the drain line and the pixel electrode can be decreased remarkably, and subsequent failure can be prevented.

(2) Light leakage from an interval between the drain line 20 and the pixel electrode 46 can be prevented by forming a shield layer using the gate electrodes 48, 68 and the pixel electrode 46 to cover the shield layer. Accordingly, a black matrix formed on the color filter substrate 18, which is facing the transparent insulating substrate 10, can be omitted. The omission of the black matrix makes it possible to suppress a displacement in the alignment of the transparent insulating substrate 10 and the color filter substrate 18 and to improve the aperture ratio of the pixel portion.

(3) For the same reason as the above (2), the added capacitance Cadd can be formed by overlapping the pixel electrode 46 and the gate line 68 in a plane (the other becomes a parasitic capacitance by overlapping the gate line 68 and the source electrode 62). Therefore, the light leakage from this portion can be prevented, and the aperture ratio can be improved.

(4) In the interval between the drain line 20 and the pixel electrode 46, the gate insulating layer 54 and the laminated insulating film of the gate insulating layer 54 the protective film 44 form a capacitive coupling via the shielding film 70, as shown in FIG. 5. Therefore, the parasitic capacitance between the above two electrodes can be decreased.

The number of photomasks, when the structure of the present embodiment is adopted, is six including (1) gate electrode, (2) $n^+$.a-Si layer 58/amorphous silicone semiconductor layer 56, (3) gate insulating layer 54, (4) source electrode 52·drain electrode 50, (5) protective film 44, and (6) pixel electrode 46. However, the photomask for the gate insulating layer can be omitted, and the gate insulating layer can be manufactured simultaneously using the mask pattern for the protective film. In this case, since the number of the photomasks is decreased to 5, an increase in the number of manufactured panels, that is, an improvement of the throughput, can be achieved. The previous explanation was provided in consideration of the TFT element portion. However, the terminal portion can be manufactured naturally by the same process (no additional steps is necessary), and this point is one feature of the present invention.

The structure of the drain terminal portion 14 of the TFT panel, which has been manufactured with five photomasks, is indicated in FIG. 6. The features of the drain terminal portion 14 indicated in FIG. 6 in comparison with the case using six photomasks are that the gate insulating layer 54 is located under the drain line 20, and that both edges of the gate insulating layer 54 and the protective film 44 are aligned in a plane. The above features are based on omitting the manufacturing of the gate insulating layer using a photomask, and the gate insulating layer 54 and the protective film 44 are manufactured simultaneously using the same photomask, as explained previously.

In accordance with the method explained above, TFT substrates were manufactured. As the ITO film 42, the p-ITO film, of which the substrate temperature was 200° C., was used. In order to compare them to each other, the following three kinds of substrates, ten of each, were manufactured.

(a) Gate electrode: Cr-50 wt % Mo alloy film/source electrode·drain electrode: Cr-50 wt % Mo alloy film.

(b) Gate electrode: Cr-50 wt % Mo alloy film/source electrode·drain electrode: Cr film.

(c) Gate electrode: Cr film/source electrode·drain electrode: Cr-50 wt % Mo alloy film.

All of the above metal films were deposited under the same condition of substrate temperature of 200° C., as described in the embodiment 2. The etching was performed by the method explained in the embodiment 3. Therefore, the taper shapes were formed around the gate electrodes of (a) and (b), and an approximately perpendicular pattern edge was formed with the gate electrode of (c). In the course of manufacturing the panels, when the electrode film of the structure (c) is deposited, a transferring problem, which was assumed to have originated from a warp of the substrate, occurred in the cluster type sputtering apparatus. Breakage of the substrate could be avoided by transferring it carefully, but the process takes a long time. The trouble is based on the high stress in the Cr film and will result in a decrease in the throughput during mass production. In this point, the advantage of the Cr—Mo alloy film is clearly indicated.

The results of investigating the defects in the obtained panels are indicated in Table 4.

TABLE 4

| Structure | Number of Panels | |
|---|---|---|
| | Gate line breakage occurred | Drain line breakage occurred |
| (a) | 0 | 1 |
| (b) | 0 | 10 |
| (c) | 2 | 0 |

In accordance with Table 4, in one panel of structure (a), a breakage of the drain line was observed. However, investigation of the panel revealed that the reason for the breakage was the presence of foreign particles in the CVD film, and the drain line 20 itself did not have any problems. With the structure (b), the breakage of the drain lines occurred in all the panels. Observation of the cross sectional structure of the element revealed that the breakage of the drain lines made of Cr occurred at the portion where the drain line crosses over the gate line. It is assumed that the cause for this is a large stress such as approximately 1000 MPa, which is generated in the Cr film, the stress being a tensile stress. Therefore, the breakage of the line occurred at the step crossing over portion. With the structure (c), a breakage of the gate line was observed in two panels.

The reason for the breakage was investigated, and it was assumed that micro defects existed in the glass substrate, that the etching agent was impregnated into the defects when etching the Cr lines, and that the breakage of the Cr occurred. Furthermore, the same defects existed in the panel using the Cr—Mo alloy line, but since the Cr—Mo alloy had a remarkably larger crystal grain size than the Cr line and the ductility of the Cr—Mo film was larger than that of the Cr film, the breakage of the Cr—Mo alloy line did not occur during the etching process. Furthermore, Table 4 revealed that the breakage of the drain line did not occur, although the taper shape was not formed around the gate line. In accordance with this observation, the advantage of a wider process margin can be expected when using the Cr—Mo alloy film for the line.

Then, all of the panels which did not experience any defect, and a part of the panels which did experience defects, were transferred to the LCD manufacturing process, and LCD devices were manufactured. That is, an alignment layer was formed on a counter substrate having the color filters and the common transparent electrodes, and the TFT panel, respectively. Subsequently, the surface of the alignment layer was processed by a rubbing treatment, and beads were dispersed onto the surface of the alignment layer. After applying a sealing agent onto peripheral portions of the display area of the substrate, the counter substrate and the TFT panel were adhered together. Then, the adhered body was cut to form cells, liquid crystal material was injected into an interval between the substrate and the TFT panel through an inlet, and the inlet was sealed. Subsequently, a part of the counter substrate corresponding to the terminal portion of the TFT panel was cut off, and the polarizers were fixed to the surface of the TFT panel. After completing the LCD device in the manner described above, the display characteristics of the LCD device were examined by installing a back light. As a result, no spot defects and linear defects, which are caused by lack of pixels, were not observed in the panel where the Cr—Mo alloy film was used for the drain line 20, and the panel was confirmed to be in a preferable condition. No spot defect means that the source electrodes 52 and the transparent pixel electrodes 46 are in a preferable contacting condition at the contact holes CN1 (the opening 60) shown in FIG. 3 and FIG. 5.

Then, the panel was operated after mounting an external signal circuit using driving circuit chip 22 and FPC 26 at the terminal portion of the panel. As a result, it was found that an irregularity of display was generated with the LCD device using a Cr film as the drain line. The reason for this was studied, and it was revealed that the contact of ITO/Cr at the terminal wiring portion was insufficient, and a high specific contact resistance at the above portion generated the irregularity of display. Then, using a contact resistance evaluating element provided at an outer portion of the panel, a critical value of the specific contact resistance for generating the irregularity of display was determined. As a result, it was revealed that the irregularity of display did not occur if the specific contact resistance was smaller than approximately $1 \times 10^5$ $\Omega\mu m^2$. When the Cr—Mo alloy film was used as the lines, the irregularity of display was not generated at all.

After evaluating the panel, the panel was subjected to a high temperature and high humidity test for confirming its reliability. It was confirmed in this test that the panels using the Cr—Mo alloy film as the lines were not all deteriorated in display quality.

Figure 7A:
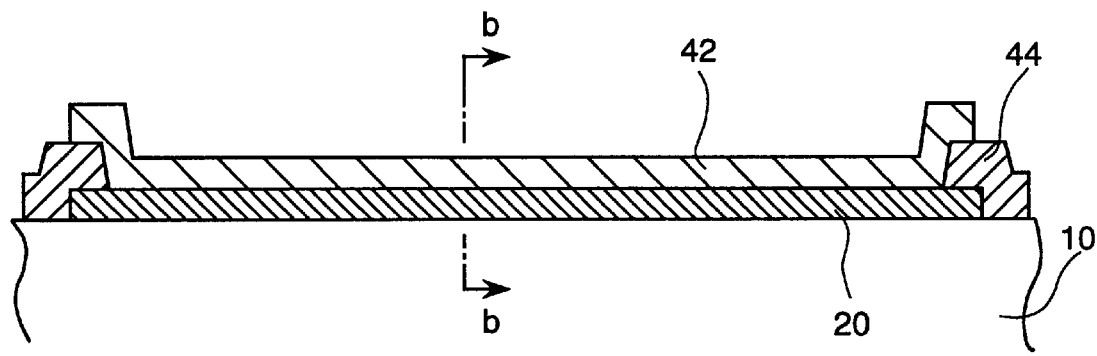
FIGS. 7A and 7B are respective cross sections of the drain terminals representing another modified example.
Figure 7B:
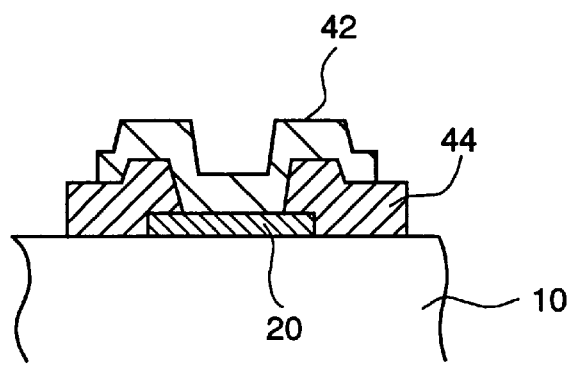

A modified example of the terminal portion structure is indicated in FIG. 7. In accordance with the structure shown in FIG. 7, the drain lines 20 and the ITO film 42 are bonded at almost all the surface, except for the respective end portions of the drain lines 20 which were covered with the passivation film 44. By adopting the above structure, even if water has entered and reached the surface of the ITO film 42 from outside through the resin for packaging, the intrusion of water to the interface between the ITO film 42 and the drain lines 20 can be suppressed.

In order to obtain the advantages of the present invention, it is essential to decrease the contact resistance at the connecting portion by using Cr—Mo alloy as the material for one of the connecting elements which make up the signal transmission paths. Therefore, as another modified example, even if the gate line and/or drain line are composed of a laminated film, and the alloy of the present invention is applied to only the uppermost layer of the laminated layer, in other words, to only the surface of the opening, the advantages of the present invention can be achieved. Practically, it was confirmed that if the uppermost Cr—Mo alloy layer of the laminated layer was formed with a film thickness of at least 20 nm, the contact resistance was decreased, and the advantages of the present invention could be achieved. As described later, the specific contact resistance at the connecting portion can be decreased to $1 \times 10^5$ $\Omega\mu m^2$ by using an alloy composed of at least a chemical element selected from the group consisting of Nb, Mo, Ta, and W, and Cr, instead of the Cr—Mo alloy.

The reason why the Cr—Mo alloy film has a remarkably low contact resistance in comparison with the Cr film is assumed to be that, in accordance with the result of a study of the film surface with a photoelectron spectroscope, the thickness of an oxide film generated on the surface of the Cr—Mo alloy film is thinner than that on the surface of the Cr film, and the structure of the oxide film differs from that on the surface of the Cr film.

As explained above, a high production yield can be obtained in both the manufacturing process and the reliability tests by using the Cr—Mo alloy film as the line film of the TFT panel, and accordingly, a decrease in the production cost of the liquid crystal display device can be attained.

Embodiment 6

Hereinafter, the applications of film made of metals other than Cr—Mo alloy will be explained.

In order to use an alloy film made of metals other then Cr—Mo alloy, the alloy film was manufactured by adding Nb, Ta, and W, respectively, to Cr by 5, 10, 20, 30, and 50% by weight, and the specific resistance and film stress of these alloy films was evaluated.

The method of manufacturing these alloys was the same as the method described in embodiment 2. In accordance with the results measured for these alloys, the film stress of the Cr—Nb alloy showed almost the same trend as the Cr—Mo alloy which was explained previously in embodiment 2. In the cases of the Cr—Ta alloy and the Cr—W alloy, a decrease of the stress could be observed from a smaller amount of the additives, namely, approximately 10% by weight as compared to the case of Cr—Mo alloy. Therefore, it can be concluded that the same advantages as the Cr—Mo alloy film can be obtained by forming alloys from any of the chemical elements described above with Cr. Regarding the specific resistance, it was found that any alloy film made of Cr—Nb, Cr—Ta, and Cr—W, respectively, in the present embodiment had a slightly higher specific resistance than the Cr—Mo alloy film. Therefore, it can be concluded that, although each of Nb, Ta, and W is remarkably effective as a chemical element to form an alloy film with Cr, the Cr—Mo alloy is most superior in comparison with the other alloys in consideration of both film stress and specific resistance.

Although the content of Mo in the Cr—Mo-alloy film in the foregoing description is mainly 50% by weight, the Cr—Mo alloy, of which the Mo content is in a range as wide as from 20 to 80% by weight, can be used in order to decrease the specific contact resistance. However, by increasing the Mo content, the etching rate using cerium (IV) nitrate aqueous ammonium solution is decreased, and by decreasing the Mo content, the film stress is increased. Therefore, the Mo content is preferably in the range of 30–55% by weight.

As explained above, in accordance with the present invention, the contact resistance at the connecting portion can be decreased by composing the material of the one of the connecting elements composing the signal transfer lines with an alloy made of a chemical element selected from the group consisting of Nb, Mo, Ta, and W, with Cr, and accordingly, the present invention can contribute to an improvement in the production yield.

What is claimed is:

1. An active matrix type liquid crystal display device comprising:

a pair of substrates, at least one of which is transparent;

a liquid crystal layer interposed between said pair of substrates;

means for generating scan pulses;

means for generating image data;

a plurality of scan lines, which are arranged dispersedly on one substrate of the pair of substrates and are connected to the means for generating scan pulses; and a plurality of data signal lines, which are arranged so as to cross with the plurality of scan lines in a manner to form a matrix and are connected to the means for generating image data; and further, comprising, in a plurality of pixels surrounded by the plurality of the scan lines and the plurality of the data signal lines:

transparent pixel electrodes arranged on one substrate of the pair of substrates, counter electrodes arranged to face the transparent pixel electrodes with the liquid crystal layer being held between them and supplied with a liquid crystal driving voltage, and an insulating film which covers respective semiconductor active elements for driving the pixels connected to the scan lines, the data signal lines, and the transparent pixel electrodes, respective scan lines, and respective data signal lines; wherein material forming portions connecting the scan lines with the means for generating scan pulses, and connecting the data signal lines with the means for generating image data, a substantially similar composition which is an alloy of Cr containing at least a chemical element selected from the group consisting of Nb, Mo, Ta and W, and wherein the scan lines and the means for generating scan pulses are connected to each other via a first opening formed in the insulating film, the data signal lines and the means for generating image data are connected to each other via a second opening formed in the insulating film, a polycrystalline thin film, which is connected to the means for generating scan pulses, is inserted into the first opening, and a polycrystalline thin film, which is connected to the means for generating image data, is inserted into the second opening, and the polycrystalline thin film is composed of indium tin oxide, which is made of mainly indium oxide and added tin oxide, having a specific resistance of, at the utmost, $6 \times 10^{-4}$ $\Omega$cm.

2. The active matrix type liquid crystal display device as claimed in claim 1, wherein said scan lines and said means for generating scan pulses are connected via plural first openings formed along said scan lines, and said data signal lines and said means for generating image data are connected to each other via plural second openings formed along said data signal lines.

3. The active matrix type liquid crystal display device as claimed in claim 1, wherein a specific contact resistance of the polycrystalline thin film with the alloy at the first opening and the second opening is at the utmost, $1 \times 10^5$ $\Omega$ $\mu m^2$.

4. The active matrix type liquid crystal display device as claimed in claim 1, wherein the the chemical element which forms an alloy with Cr is in the range of 20~80% by weight.

5. The active matrix type liquid crystal display device as claimed in claim 1, wherein lines for transmitting scan pulses, which are arranged on the substrate outside the pixels as lines belonging to the means for generating scan pulses and transmitting the scan pulses are connected to first members via an anisotropically conductive film;

lines for transmitting image data, which are arranged on the substrate outside the pixels as lines belonging to the means for generating image data and transmitting the image data are connected to second members via an anisotropically conductive film;

a polycrystalline thin film is formed at the connected plane of said lines for transmitting scan pulses with the first members and at the connected plane of said lines for transmitting image data with the second members, respectively; and said polycrystalline thin film is composed of indium tin oxide, which is made of mainly indium oxide and added tin oxide, having a specific resistance of, at the utmost, $6 \times 10^{-4}$ $\Omega$cm.

6. The active matrix type liquid crystal display device as claimed in claim 1, wherein at least one of the scan lines and the data signal lines is formed at other than the connecting portions thereof of a material other than the material of the connection portions thereof.

7. A liquid crystal display apparatus as claimed in claim 6, wherein said polycrystalline film is composed of ITO comprising indium oxide as a main component and tin oxide as an additive.

8. A liquid crystal display apparatus as claimed in claim 6, wherein said polycrystalline film, which forms a part of said signal line, is formed on said Cr—Mo alloy film at said connecting portion.

9. A liquid crystal display apparatus as claimed in claim 6, wherein a specific contact resistance between said polycrystalline film and said Cr—Mo alloy film is equal to or less than $1 \times 10^5$ $\Omega$cm$^2$.

10. An active matrix type liquid crystal display device comprising:

a pair of substrates, at least one of which is transparent;

a liquid crystal layer interposed between said pair of substrates;

means for generating scan pulses;

means for generating image data;

a plurality of scan lines, which are arranged dispersedly on one substrate of the pair of substrates and are connected to the means for generating scan pulses; and a plurality of data signal lines, which are arranged so as to cross with the plurality of the scan lines in a manner to form a matrix and are connected to the means for generating image data; and further, comprising, in a plurality of pixels surrounded by the plurality of the scan lines and the plurality of the data signal lines:

transparent pixel electrodes arranged on one substrate of the pair of substrates, counter electrodes arranged to face the transparent pixel electrodes with the liquid crystal layer being held between and supplied with a liquid crystal driving voltage, and an insulating film which covers respective semiconductor active elements for driving the pixels connected to the scan lines, the data signal lines, and the transparent pixel electrodes, respective scan lines, and respective data signal lines; wherein materials forming at least one portion connecting said scan lines with the means for generating scan pulses, at least one portion connecting the data signal lines with the means for generating image data, and at least one portion connecting electrodes composing said semiconductor active elements for driving pixels with the transparent pixel electrodes, the materials having a similar composition which is an alloy of Cr containing at least a chemical element selected from the group consisting of Nb, Mo, Ta and W;

the scan lines and the means for generating scan pulses are connected to each other via a first opening formed in the insulating film, the data signal lines and the means for generating image data are connected to each other via a second opening formed in the insulating film, the electrodes of the semiconductor active element for driving pixels and the transparent pixel electrodes are connected to each other via a third opening formed in the insulating film, a polycrystalline thin film, which is connected to the means for generating scan pulses, is inserted into the first opening, a polycrystalline thin film, which is connected to the means for generating image data, is inserted into the second opening, a polycrystalline thin film, which is connected to the transparent pixel electrodes, is inserted into the third opening, and the polycrystalline thin film is composed of indium tin oxide, which is made of mainly indium oxide and added tin oxide, having a specific resistance of, at the utmost, $6 \times 10^{-4}$ Ωcm.

11. The active matrix type liquid crystal display device as claimed in claim 10, wherein
said scan lines and said means for generating scan pulses are connected via plural first openings formed along said scan lines, and
said data signal lines and said means for generating image data are connected to each other via plural second openings formed along said data signal lines.

12. The active matrix type liquid crystal display device as claimed in claim 10, wherein
a specific contact resistance of the polycrystalline thin film with the alloy at the first opening and the second opening is, at the utmost, $1 \times 10^5$ Ω $\mu m^2$.

13. The active matrix type liquid crystal display device as claimed in claim 10, wherein
a specific contact resistance of the polycrystalline thin film with the alloy at the first opening, the second opening, and the third opening is, at the utmost, $1 \times 10^5$ Ω $\mu m^2$.

14. The active matrix type liquid crystal display device as claimed in claim 10, wherein
the the chemical element which forms an alloy with Cr is in the range of 20–80% by weight.

15. The active matrix type liquid crystal display device as claimed in claim 10, wherein
lines for transmitting scan pulses, which are arranged on the substrate outside the pixels as lines belonging to the means for generating scan pulses and transmitting the scan pulses are connected to first members via an anisotropically conductive film;
lines for transmitting image data, which are arranged on the substrate outside the pixels as lines belonging to the means for generating image data and transmitting the image data are connected to second members via an anisotropically conductive film;
a polycrystalline thin film is formed at the connected plane of said lines for transmitting scan purses with the first members and at the connected plane of said lines for transmitting image date with the second members, respectively; and
said polycrystalline thin film is composed of indium tin oxide, which is made of mainly indium oxide and added tin oxide, having a specific resistance of, at the utmost, $6 \times 10^{-4}$ Ωcm.

16. The active matrix type liquid crystal display device as claimed in claim 10, wherein at least one of the scan lines and the data signal lines is formed at other than the connecting portions thereof of a material other than the material of the connection portions thereof.

17. A liquid crystal display apparatus as claimed in claim 16, wherein said ITO has a specific resistance equal to or less than $6 \times 10^{-4}$ Ωcm.

18. An active matrix type liquid crystal display device comprising:
a pair of substrates, at least one of which is transparent;
a liquid crystal layer interposed between said pair of substrates;
means for generating scan pulses;
means for generating image data;
a plurality of scan lines, which are arranged dispersedly on one substrate of the pair of substrates and are connected to the means for generating scan pulses; and
a plurality of data signal lines, which are arranged so as to cross with the plurality of the scan lines in a manner to form a matrix and are connected to the means for generating image data; and
further, comprising, in a plurality of pixels surrounded by the plurality of the scan lines and the plurality of the data signal lines:
a pair of electrodes including a pixel electrode and a counter electrode;
an insulating film which covers respective semiconductor active elements for driving the pixels connected to the scan lines, the data signal lines, and the pixel electrode, respective scan lines, and respective data signal lines; and
material forming portions connecting the scan lines with the means for generating scan pulses, and connecting the data signal lines with the means for generating image data, the material having a substantially similar composition which is an alloy of Cr containing at least a chemical element selected from the group consisting of Nb, Mo, Ta and W; and
wherein the scan lines and the means for generating scan pulses are connected to each other via a first opening formed in the insulating film, the data signal lines and the means for generating image data are connected to each other via a second opening formed in the insulating film, a polycrystalline thin film, which is connected to the means for generating scan pulses, is inserted into the first opening, and a polycrystalline thin film, which is connected to the means for generating image data, is inserted into the second opening, and the polycrystalline thin film is composed of indium tin oxide, which is made of mainly indium oxide and added tin oxide, having a specific resistance of, at the utmost, $6 \times 10^{-4}$ Ωcm.

19. The active matrix type liquid crystal display device as claimed in claim 18, wherein at least one of the scan lines and the data signal lines is formed at other than the connecting portions thereof of a material other than the material of the connection portions thereof.

20. A liquid crystal display apparatus comprising a structure, wherein:
Cr—Mo alloy film is formed at portions connecting source electrodes of transistors with one end of a transparent pixel electrode which is composed of polycrystalline film; and
a signal line which is composed of polycrystalline film is connected with driving circuit chips arranged on a substrate via an anisotropic conductive film.

21. A liquid crystal display apparatus comprising a pair of substrates, a liquid crystal layer interposed between the pair of substrates, and at least transistors, transparent pixel electrodes, signal lines and driving circuit chips being provided on at least one of the pair of substrates, wherein:

a Cr—Mo alloy film is formed at portions connecting source electrodes of the transistors with one end of one of the transparent pixel electrodes which is composed of polycrystalline film; and a signal line which is composed of polycrystalline film is connected with the driving circuit chips which are arranged on one of the pair of substrates via an anisotropic conductive film.

22. A liquid crystal display apparatus comprising a structure, wherein:

Cr—Mo alloy film is formed at portions connecting source electrodes of transistors with one end of a transparent pixel electrode which is composed of polycrystalline film and at portions connecting signal electrodes with one end of a data signal line which is composed of polycrystalline film; and a signal line which is composed of polycrystalline film is connected with driving circuit chips arranged on a substrate via an anisotropic conductive film.

23. A liquid crystal display apparatus comprising a structure, wherein:

Cr—Mo alloy film is formed at portions connecting source electrodes of transistors with one end of a transparent pixel electrode which is composed of polycrystalline film and at portions connecting signal electrodes with one end of a scan line which is composed of polycrystalline film; and a scan line which is composed of polycrystalline film is connected with driving circuit chips arranged on a substrate via an anisotropic conductive film.

* * * * *